US010608683B2

(12) United States Patent
Soulier et al.

(10) Patent No.: US 10,608,683 B2
(45) Date of Patent: Mar. 31, 2020

(54) METHOD FOR CANCELLING MULTI-PATH SIGNALS FOR FREQUENCY-MODULATED RADIO SIGNAL RECEIVER

(71) Applicants: Continental Automotive France, Toulouse (FR); Continental Automotive GmbH, Hannover (DE)

(72) Inventors: Gérald Soulier, Rambouillet (FR); Chao Lin, Maurepas (FR)

(73) Assignees: Continental Automotive France, Toulouse (FR); Continental Automotive GmbH, Hannover (DE)

( * ) Notice: Subject to any disclaimer, the term of this patent is extended or adjusted under 35 U.S.C. 154(b) by 0 days.

(21) Appl. No.: 16/489,742

(22) PCT Filed: May 29, 2018

(86) PCT No.: PCT/FR2018/051241
§ 371 (c)(1),
(2) Date: Aug. 29, 2019

(87) PCT Pub. No.: WO2018/220342
PCT Pub. Date: Dec. 6, 2018

(65) Prior Publication Data
US 2020/0067550 A1 Feb. 27, 2020

(30) Foreign Application Priority Data
Jun. 1, 2017 (FR) ...................................... 17 54861

(51) Int. Cl.
*H04L 27/14* (2006.01)
*H04B 17/336* (2015.01)
(Continued)

(52) U.S. Cl.
CPC ....... *H04B 1/1081* (2013.01); *H03H 21/0043* (2013.01); *H04B 1/082* (2013.01); *H04L 27/14* (2013.01); *H03H 2021/0054* (2013.01)

(58) Field of Classification Search
CPC .... H04B 1/1036; H04B 1/1081; H04B 1/082; H04B 7/0404; H04B 7/0845;
(Continued)

(56) References Cited

U.S. PATENT DOCUMENTS 6,853,633 B1 * 2/2005 Ramesh ............... H04B 14/064
370/252
6,961,019 B1 * 11/2005 McConnell ............. G01S 19/21
342/357.59

(Continued)

OTHER PUBLICATIONS

International Search Report and Written Opinion for International Application No. PCT/FR2018/051241, dated Jul. 25, 2018, 10 pages.

(Continued)

*Primary Examiner* — Pablo N Tran
(74) *Attorney, Agent, or Firm* — RatnerPrestia

(57) ABSTRACT

A method for decreasing multi-path interference, for the implementation thereof in a vehicle radio receiver including a radio reception antenna that receives a plurality of radio signals corresponding to an emitted radio signal, the plurality of signals received by the antenna being composed of time-shifted radio signals, the plurality of signals being intended to be combined in order to deliver a combined radio signal $z_n$ to be played, with $z_n = W_n^T Y_n$, the method aiming to determine the complex components of the vector of complex weights and including: introducing a temporal correlation, between the real and imaginary parts of the complex weights, that is dependent on the time shift between said received signals, by the expression of the complex weights in polar coordinates, implementing an iterative (Continued)

adaptation algorithm in order to determine the gains and delays of said complex weights able to keep constant over time the modulus of $z_n$.

7 Claims, 1 Drawing Sheet

(51) Int. Cl.
*H04B 1/10* (2006.01)
*H03H 21/00* (2006.01)
*H04B 1/08* (2006.01)

(58) Field of Classification Search
CPC ..... H04B 17/336; H04B 1/1027; H04L 27/06; H04L 41/0826; H04L 25/03057; H04L 2025/0363; H04L 27/14; H03H 21/0043; H03H 2021/0054
See application file for complete search history.

(56) References Cited

U.S. PATENT DOCUMENTS

| | | | | |
|---|---|---|---|---|
| 7,065,162 B1* | 6/2006 | Sorrells | ............... | H03D 7/00 375/343 |
| 7,127,217 B2* | 10/2006 | Tuttle | ............... | H04B 1/18 455/87 |
| 7,319,846 B2* | 1/2008 | He | ............... | H04L 1/20 455/114.2 |
| 7,899,106 B2* | 3/2011 | Camp, Jr. | ............... | H04L 27/2647 375/134 |
| 8,218,422 B2* | 7/2012 | Venturino | ............... | H04W 16/28 370/208 |
| 8,275,324 B2* | 9/2012 | Wilborn | ............... | H04W 52/223 455/127.2 |
| 8,634,505 B2* | 1/2014 | Kim | ............... | H04B 7/04 375/340 |
| 8,649,729 B2* | 2/2014 | Nightingale | ............... | H04K 3/28 375/134 |
| 9,184,820 B2* | 11/2015 | Raleigh | ............... | H04B 7/0615 |
| 9,246,736 B2* | 1/2016 | Sorrells | ............... | H03C 1/62 |
| 9,407,303 B2* | 8/2016 | Menon | ............... | H04B 7/08 |
| 9,432,152 B2* | 8/2016 | Feher | ............... | G16H 10/60 |
| 10,069,712 B2* | 9/2018 | Qian | ............... | H04L 43/16 |
| 10,243,593 B2* | 3/2019 | Pipon | ............... | H04B 1/1081 |
| 2005/0031064 A1* | 2/2005 | Kolze | ............... | H04B 1/1027 375/350 |
| 2005/0239406 A1* | 10/2005 | Shattil | ............... | H01Q 3/26 455/63.1 |
| 2006/0126753 A1* | 6/2006 | Jwa | ............... | H04B 1/71052 375/267 |
| 2007/0030932 A1 | 2/2007 | Su et al. | | |
| 2008/0013617 A1 | 1/2008 | Ooi | | |
| 2008/0212722 A1* | 9/2008 | Heikkila | ............... | H04B 1/71057 375/341 |
| 2009/0061802 A1 | 3/2009 | Aoki et al. | | |
| 2010/0189202 A1* | 7/2010 | Imao | ............... | H04B 7/0842 375/344 |
| 2012/0134394 A1* | 5/2012 | Allen | ............... | H04L 7/0008 375/219 |

OTHER PUBLICATIONS

Biedka, T.E., et al., "Convergence Analysis of the Least Squares Constant Modulus Algorithm in Interference Cancellation Applications," Mar. 1, 2000, pp. 491-501, vol. 48(3), IEEE Transactions on Communications.

* cited by examiner

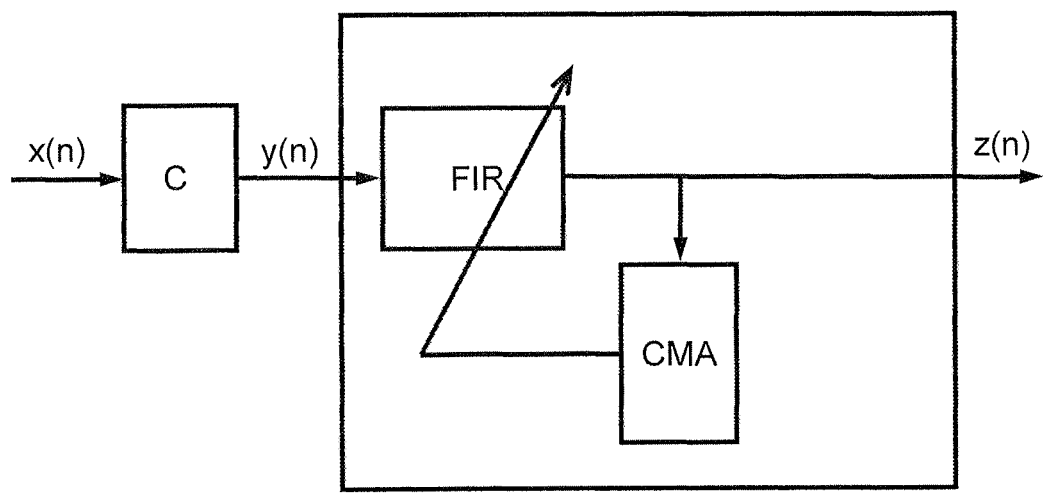

METHOD FOR CANCELLING MULTI-PATH SIGNALS FOR FREQUENCY-MODULATED RADIO SIGNAL RECEIVER

CROSS REFERENCE TO RELATED APPLICATIONS

This application is the U.S. National Phase Application of PCT International Application No. PCT/FR2018/051241, filed May 29, 2018, which claims priority to French Patent Application No. 1754861, filed Jun. 1, 2017, the contents of such applications being incorporated by reference herein.

FIELD OF THE INVENTION

The invention relates to the field of the reception of frequency-modulated radio signals, in particular in mobile radio receivers exposed to the effect of multi-paths which is known to those skilled in the art.

More precisely, the present invention relates to a method for removing reflected radio waves resulting from the multi-path effect in a receiver of frequency-modulated radio signals.

BACKGROUND OF THE INVENTION

As is known, a radio receiver, in particular in a multimedia system of a motor vehicle, is able to receive a radio signal, in particular an FM radio signal, FM being the acronym of "frequency modulation".

Such an FM radio signal, received in modulated form by a radio receiver, is subjected to various sensors and to suitable filtering so that the corresponding demodulated radio signal is able to be played back under good conditions, in particular in the passenger compartment of a motor vehicle.

Those skilled in the art know the operating principle of an FM, that is to say frequency-modulated, radio signal received by a suitable radio receiver, with a view to being demodulated and then played to listeners.

A known problem that relates to the reception of an FM radio signal via a mobile radio receiver, in particular one incorporated into a motor vehicle, resides in the fact that the FM radio signal emitted by an emitter may be reflected by natural obstacles or buildings for example, before being received by an antenna of the radio receiver. In other words, the emitted radio signal, before being received by an antenna of the receiver, may have followed various paths, of relatively long or short length.

As a result thereof a selectivity is necessary, because a given radio signal may be received by one antenna several times, with various time shifts. This problem is known to those skilled in the art, who generally refer to it as "multi-path".

With reference to the FIGURE, to partially mitigate the aforementioned drawbacks relative to multi-path, impulse response filters FIR aiming to remove the interference generated by the multiplicity of the received signals because of the multi-path effect, which was described above, have been developed. These filters FIR implement CMA algorithms, SMA being the acronym of "Constant Modulus Algorithm", that are configured to cancel out, from the set of the received signals $y_n$, those signals corresponding to secondary signals generated by the multi-path effect, with a view to delivering a processed FM radio signal $z_n$.

Thus, again with reference to the FIGURE, $x_n$ represents the signal emitted by the emitting antenna, which by definition has a constant modulus, and $y_n$ represents the radio signal received by the receiving antenna of the radio receiver of the vehicle in question, C representing the transfer function of the transmission channel between said emitting antenna and said receiving antenna.

The received radio signal $y_n$ has a non-constant modulus because it is the result of the combination of a plurality of time-shifted received signals, i.e. signals resulting from various emitted signals $x_n$ that are delayed to a greater or lesser extent.

In the end, the processed radio signal $z_n$ is the radio signal reconstructed after application of the CMA algorithm.

In the prior art, algorithms for removing multi-path signals are generally of the "constant modulus" type. Specifically, the principle of frequency modulation ensures that the emitted radio signal has a constant modulus. Thus, computational algorithms called CMA algorithms have been developed and those skilled in the art are constantly seeking to improve them, with for main constraint to ensure, after computation, a substantially constant modulus of the radio signal combined within the receiver, after processing.

CMA algorithms are iterative computational algorithms the objective of which is to determine the real and imaginary parts of complex weights to be applied to the FM radio signals received by an antenna of a radio receiver, with a view to combining them, so as to remove from the combined radio signal the interference due to multi-path.

From a mathematical point of view, the principle presented above, in which complex weights are attributed to multiple radio signals received by an antenna of a radio receiver, including in particular signals received after reflection, which are a source of multi-path interference, with a view to forming a combined radio signal to be played, after canceling out the interference due to multi-path, may be expressed as follows.

The combined radio signal is written:

$$z_n = W_n^T Y_n = \sum_{k=0}^{K-1} \overline{w_{(k)}} y_{(n-k)} = \sum_{k=0}^{K-1} \overline{(a_{(k)} + jb_{(k)})} y_{(n-k)}$$

where, at the time n, $y_n$ is the radio signal, in complex baseband, received by the antenna in question and $w_{(n)}$ is the complex weight attributed, via an impulse response filter, to said received radio signal.

In the prior art, CMA algorithms are implemented to determine the complex vector $W_n$ able to minimize the following cost function:

$$H_{CMA} = E\{(|z_n|^2 - R^2)^2\},$$

where R is a constant to be determined, corresponding to the constant modulus of the combined signal.

In the prior art, the vector $W_n$ of complex weights is considered to consist of linear complex numbers, said vector $W_n$ therefore having the following form:

$$W_n = \begin{bmatrix} a_{(0)} + jb_{(0)} \\ a_{(1)} + jb_{(1)} \\ \vdots \\ \vdots \\ a_{(K-1)} + jb_{(K-1)} \end{bmatrix}$$

The components of this vector $W_n$ of complex weights, forming the coefficients of an adaptive filter to be applied to the received radio signal, are independent of one another and the real and imaginary parts of each component are also.

The corresponding cost function may be decreased using the instantaneous gradient technique, in order to be written:

$$\nabla J_{CMA} = 2(|z_n|^2 - R^2)\nabla |z_n|^2$$
$$= 2(|z_n|^2 - R^2)\nabla (z_n \bar{z}_n)$$
$$= 2(|z_n|^2 - R^2)(z_n \nabla \bar{z}_n + \bar{z}_n \nabla z_n)$$

With $$\nabla z_n = \frac{\partial z_n}{\partial W_n} = \begin{bmatrix} Y_n \\ -jY_n \end{bmatrix}$$

and $$\nabla \bar{z}_n = \frac{\partial \bar{z}_n}{\partial W_n} = \begin{bmatrix} \overline{Y_n} \\ -j\overline{Y_n} \end{bmatrix},$$

the following is obtained:

$$\nabla J_{CMA} = 2(|z_n|^2 - R^2)\begin{bmatrix} 2\text{Re}(\bar{z}_n Y_n) \\ 2j\text{Im}(\bar{z}_n Y_n) \end{bmatrix}$$

Namely:

$$\nabla J_{CMA} = 4(|z_n|^2 - R^2)\bar{z}_n Y_n$$

The way in which the complex weights are updated is therefore expressed by the following formula:

$$W_{n+1} = W_n - \mu(|z_n|^2 - R^2)\bar{z}_n Y_n$$

A major drawback of known adaptive filtering techniques and CMA algorithms such as they are applied at the present time, with a view to independently determining the complex weights to be applied to the signals received by the antenna of a mobile radio receiver in order to eliminate there from the interference due to multi-path, resides in the fact that they sometimes converge slowly, and above all in the fact that they sometimes converge wrongly. In other words, sometimes complex weights that meet the required conditions lead to a radio signal of poor quality being played.

Stability problems are thus particularly frequent.

As is known to those skilled in the art, this difficulty with rapidly converging to correct and stable solutions is particularly present in the field of FM radio reception, because the only certain constraint exploitable a priori by algorithms resides in the fact that the modulus of the envelope of the frequency-modulated radio signal remains constant.

However, on the other hand, the antenna receives a plurality of radio signals, corresponding to the emitted radio signal having followed various paths, which are either direct or with one or more reflections, and a complex weight must be determined with a view to being applied to each of these radio signals. The equation contains a high number of unknowns and the objective of the CMA algorithms is therefore to determine the best solutions, among a set of non-optimal solutions allowing a constant modulus of the combined radio signal to be ensured.

More particularly, in scenarios where the desired radio signals coexist with radio signals transmitted over adjacent frequency channels, this problem of convergence is more pronounced. It often occurs that the complex weights obtained with CMA algorithms privilege adjacent radio signals to the detriment of the desired radio signals.

SUMMARY OF THE INVENTION

It is to mitigate these drawbacks that an aspect of the present invention is provided, with a view to allowing FM radio signals received by an antenna of a radio receiver to be combined, said signals being the product of a multi-path effect, using an improved technique aiming to remove interference due to multi-path.

To this end, an aspect of the present invention in particular makes provision to introduce, into the method aiming in fine to combine FM radio signals produced by a multi-path effect, which signals are received by an antenna of a radio receiver, a temporal correlation between said received signals.

Thus, rather than considering the complex weights to be attributed to each of said signals received by said antenna as independent, an aspect of the present invention proposes a model that is adaptive from the temporal point of view in order to improve the performance of the radio receiver from the point of view of removal of interference due to multi-path.

The method for decreasing multi-path interference in an FM radio receiver, according to an aspect of the invention, thus incorporates a temporal correlation between the respective gains and phase shifts of the plurality of signals received by the antenna of a radio receiver, in order to decrease the degrees of freedom of the equation to be solved with the iterative algorithms implemented, which may be algorithms such as CMA algorithms.

In this way, said iterative algorithms implemented to determine the complex weights to be attributed to each of the received radio signals converge more rapidly and are more stable.

More precisely, one subject of an aspect of the present invention is a method for decreasing multi-path interference, for implementation thereof in a vehicle radio receiver, said radio receiver being intended to receive an emitted radio signal and comprising a radio reception antenna that receives a plurality of radio signals corresponding to said emitted radio signal, said plurality of signals received by said antenna being composed of time-shifted radio signals resulting from a multi-path effect, said plurality of radio signals being intended to be combined in order to deliver a combined radio signal $z_n$ to be played, with $z_n = W_n^T Y_n$ at the time n, where $Y_n$ is a vector the components of which correspond to the plurality of received signals, expressed in complex baseband, and $W_n$ is a vector the components of which correspond to complex weights intended to be attributed to each of the radio signals of said plurality of received radio signals, respectively, in order to form the combined radio signal $z_n$ in which a set of secondary radio signals resulting from the multi-path effect are canceled out, said method aiming to determine said complex components of said vector of complex weights and comprising the following steps:

introducing a temporal correlation between the real and imaginary parts of said complex weights, said correlation being dependent on the time shift between said signals of said plurality of received radio signals, by means of the expression of said complex weights in polar coordinates, so that $$Wn = \begin{bmatrix} g_o \exp(j\theta_o) \\ g_1 \exp(j\theta_1) \\ \vdots \\ \vdots \\ g_{K-1} \exp(j\theta_{K-1}) \end{bmatrix},$$

so as to incorporate an interdependence between the real and imaginary parts of said complex weights, and implementing an iterative adaptation algorithm in order to determine the $g_0, g_1, \ldots, g_{k-1}$ and $\theta_0, \theta_1, \ldots, \theta_{k-1}$ able to keep constant over time the modulus of $z_n$.

By virtue of the method according to an aspect of the invention, the iterative algorithms implemented to determine the complex weights $W_n$ converge more rapidly and have an improved stability, by virtue of the decrease in the degrees of freedom, which decrease is obtained by introducing a temporal correlation inducing an interdependence in the update of the coefficients of said complex weights.

Advantageously, said iterative adaptation algorithm is a constant-modulus adaptation algorithm.

According to one embodiment, the method according to an aspect of the invention comprises determining a constant R corresponding to the modulus of the envelope of the frequency-modulated radio signal emitted, the implementation of the iterative adaptation algorithm consisting in determining $G_n, \Theta_n$, able to minimize over time the cost function characterized by the following instantaneous gradient:

$$\nabla J_{CMA} = 2(|z_n|^2 - R^2) \begin{bmatrix} 2\mathrm{Re}[z_n \exp(j\Theta_n)^\circ \overline{Y_n}] \\ -2\mathrm{Im}[z_n G_n {}^\circ \exp(j\Theta_n)^\circ \overline{Y_n}] \end{bmatrix}$$

where $G_n$ is a vector composed of the complex gains of each of the complex weights of the vector of complex weights at the time n, $\theta_n$ is the vector composed of the complex delays of each of the complex weights of the vector of complex weights at the time n and the operator "°" is defined as performing the multiplication of two vectors, component by component, the resultant being a vector.

According to one embodiment, the respective variations in $G_n, \Theta_n$ over time are computed by means of the following formulae:

$$G_{n+1} = G_n - \mu_g (|z_n|^2 - R^2) \mathrm{Re}[z_n \exp(j\Theta_n)^\circ \overline{Y_n}]$$

$$\Theta_{n+1} = \Theta_n + \mu_\theta (|z_n|^2 - R^2) \mathrm{Im}[z_n G_n {}^\circ \exp(j\Theta_n)^\circ \overline{Y_n}]$$

where $G_n$ is a vector composed of the complex gains of each of the complex weights of the vector of complex weights at the time n, and $\Theta_n$ is the vector composed of the complex delays of each of the complex weights of the vector of complex weights at the time n.

An aspect of the present invention also relates to a radio receiver comprising a microcontroller configured to implement the method such as briefly described above.

An aspect of the present invention also relates to a motor vehicle comprising a radio receiver such as briefly described above.

BRIEF DESCRIPTION OF THE DRAWINGS

An aspect of the invention will be better understood on reading the following description, which is given solely by way of example, and with reference to the appended drawing which shows, in the FIGURE, a block diagram of a method for cancelling out multi-path radio signals.

DETAILED DESCRIPTION OF THE PREFERRED EMBODIMENTS

The method for adapting an FM radio signal according to an aspect of the invention is presented with a view to an implementation, principally, in a radio receiver of a multimedia system on board a motor vehicle. However, an aspect of the present invention may be implemented in any other technical field, and in particular in any type of FM radio receiver.

An aspect of the present invention proposes to introduce an adaptive temporal model, in order to take into account the temporal correlation that exists, from the physical point of view, between the multi-path FM radio signals received by the antenna of the radio receiver in question.

It is known, in another technical field relative to radars, to use an adaptive temporal model to combine the signals received by a radar antenna. The techniques implemented in the field of radars are however not transposable as such to the field of FM radio reception.

The adaptive temporal model implemented in the world of radars is in fact based on the implementation of an impulse response filter able to apply, to the vector of received complex signals, a complex weight vector that is written:

$$Wn = \begin{bmatrix} \exp(j2\pi F_d 0T) \\ \exp(j2\pi F_d 1T) \\ \vdots \\ \vdots \\ \exp(j2\pi F_d (K-1)T) \end{bmatrix}$$

This model does not allow multi-path signals to be removed in the field of FM radio reception because each path followed by each of the time-shifted, received multi-path signals has, in the case of an FM radio signal, a specific gain that is dependent on the distance traveled by the radio wave, said distance not being a linear frequency-dependent function, contrary to the case of radar reception.

According to an aspect of the invention, the complex weights of the temporal adaptive model are thus stated in polar coordinates, so as to introduce, into the system, a strong temporal correlation between said complex weights, while taking into account the respective gain of each of the received multi-path signals. The vector of complex weights, which forms an adaptive filter to be applied to the received radio signal, is therefore written:

$$Wn = \begin{bmatrix} g_o \exp(j\theta_o) \\ g_1 \exp(j\theta_1) \\ \vdots \\ \vdots \\ g_{K-1} \exp(j\theta_{K-1}) \end{bmatrix}$$

Hence, according to an aspect of the invention, an iterative algorithm is implemented to determine the values $g_k$ and $\theta_k$ able to minimize the following cost function:

$$J_{CMA} = E\{(|z_n|^2 - R^2)^2\} \quad \quad 5$$

where R is a constant to be determined, corresponding to the modulus of the envelope of the FM radio signal, for example able to be obtained by averaging the power of the combined received signal.

The computation of the instantaneous gradient of this cost function leads to:

$$\nabla J_{CMA} = 2(|z_n|^2 - R^2)\nabla |z_n|^2$$
$$= 2(|z_n|^2 - R^2)\nabla (z_n \bar{z}_n)$$
$$= 2(|z_n|^2 - R^2)(z_n \nabla \bar{z}_n + \bar{z}_n \nabla z_n)$$

Differently to the prior art, the model of the FM radio signals received is then written:

$$z_n = W_n^T Y_n = \sum_{k=0}^{K-1} \overline{w_{(k)}} y_{(n-k)} = \sum_{k=0}^{K-1} \overline{g_{(k)} \exp(j\theta_{(k)})} y_{(n-k)}$$

where K is the number of complex weights, i.e. the number of coefficients of the adaptive filter to be applied to the received radio signal.

Therefore, writing the instantaneous gradient makes it possible to obtain:

$$\nabla \bar{z}_n = \frac{\partial \bar{z}_n}{\partial W_n} = \begin{bmatrix} \exp(j\Theta_n) \circ \overline{Y_n} \\ jG_n \circ \exp(j\Theta_n) \circ \overline{Y_n} \end{bmatrix}$$

and $$\nabla z_n = \frac{\partial z_n}{\partial W_n} = \begin{bmatrix} \exp(-j\Theta_n) \circ Y_n \\ -jG_n \circ \exp(-j\Theta_n) \circ Y_n \end{bmatrix}$$

where $G_n$ is a vector composed of the complex gains of each of the complex weights of the vector of complex weights at the time n, $\Theta_n$ is the vector composed of the complex delays of each of the complex weights of the vector of complex weights at the time n and the operator "∘" is defined as performing the multiplication of two vectors, component by component, the resultant being a vector.

The following expression of the gradient of the cost function is obtained therefrom:

$$\nabla J_{CMA} = 2(|z_n|^2 - R^2) \begin{bmatrix} 2\mathrm{Re}[z_n \exp(j\Theta_n) \circ \overline{Y_n}] \\ -2\mathrm{Im}[z_n G_n \circ \exp(j\Theta_n) \circ \overline{Y_n}] \end{bmatrix}$$

The gains and phases of each of the complex weights to be determined are therefore updated over time by virtue of the following formulae:

$$\begin{cases} G_{n+1} = G_n - \mu_g(|z_n|^2 - R^2)\mathrm{Re}[z_n \exp(j\Theta_n) \circ \overline{Y_n}] \\ \Theta_{n+1} = \Theta_n + \mu_\theta(|z_n|^2 - R^2)\mathrm{Im}[z_n G_n \circ \exp(j\Theta_n) \circ \overline{Y_n}] \end{cases}$$

where $\mu_g$ and $\mu_\theta$ are iterative steps chosen for the update of the gains and phases of each of the complex weights. It is known to those skilled in the art that the larger the size of the iterative steps p, the faster the algorithms converge, but with a lower precision. In contrast, for iterative steps p of small size, the convergence of the algorithms is slow, but with a higher precision. In practice, the final choice as to the value of the iterative steps p is often made in the field, empirically during campaigns of trials.

The strong interdependency between the real and imaginary parts of the complex weights to be determined will be evident from these formulae.

The implementation of iterative algorithms on these formulae, in particular CMA algorithms, with the constraint of minimizing the cost function described above, thus converges more efficiently than in the prior art. Specifically, the temporal correlation introduced above induces an interdependency in the update of the coefficients, decreasing the number of degrees of freedom, unlike CMA algorithms such as implemented in the prior art, with which the coefficients of the complex weights are independent linear cartesians.

By virtue of an aspect of the invention, the CMA algorithms converge to a smaller subset of solutions, said subset being included in the set of possible solutions of the CMA algorithms such as implemented in the prior art.

The implementation of the method according to an aspect of the invention, via an impulse response filter FIR, therefore allows secondary signals produced by the multi-path effect to be removed with a better stability than in the prior art.

It is furthermore specified that aspects of the present invention are not limited to the embodiment described above, making recourse to CMA algorithms, and has variants that will appear obvious to those skilled in the art. In particular, other types of iterative algorithms may indeed be implemented.

The invention claimed is:

1. A method for decreasing multi-path interference, for implementation thereof in a vehicle radio receiver, said radio receiver being intended to receive an emitted radio signal and comprising a radio reception antenna that receives a plurality of radio signals corresponding to said emitted radio signal, said plurality of signals received by said antenna being composed of time-shifted radio signals resulting from a multi-path effect, said plurality of radio signals being intended to be combined in order to deliver a combined radio signal $z_n$ to be played, with $z_n = W_n^T Y_n$ at the time n, where $Y_n$ is a vector the components of which correspond to the plurality of received signals, expressed in complex baseband, and $W_n$ is a vector the components of which correspond to complex weights intended to be attributed to each of the radio signals of said plurality of received radio signals, respectively, in order to form the combined radio signal $z_n$ in which a set of secondary radio signals resulting from the multi-path effect are canceled out, said method aiming to determine said complex components of said vector of complex weights and comprising:

Introducing a temporal correlation between the real and imaginary parts of said complex weights, said correlation being dependent on the time shift between said signals of said plurality of received radio signals, by means of the expression of said complex weights in polar coordinates, so that $$Wn = \begin{bmatrix} g_o \exp(j\theta_o) \\ g_1 \exp(j\theta_1) \\ \vdots \\ \vdots \\ g_{K-1} \exp(j\theta_{K-1}) \end{bmatrix},$$

so as to incorporate an interdependence between the real and imaginary parts of said complex weights, and Implementing an iterative adaptation algorithm in order to determine the $g_0, g_1, \ldots, g_{k-1}$ and $\theta_0, \theta_1, \ldots, \theta_{k-1}$ able to keep constant over time the modulus of $z_n$.

2. The method as claimed in claim 1, wherein said iterative adaptation algorithm is a constant-modulus adaptation algorithm.

3. The method as claimed in claim 2, comprising determining a constant R corresponding to the modulus of the envelope of the frequency-modulated radio signal emitted, the implementation of the iterative adaptation algorithm consisting in determining $G_n$, $\Theta_n$ able to minimize over time the cost function characterized by the following instantaneous gradient:

$$\nabla J_{CMA} = 2(|z_n|^2 - R^2) \begin{bmatrix} 2\text{Re}[z_n \exp(j\Theta_n)^\circ \overline{Y_n}] \\ -2\text{Im}[z_n G_n{}^\circ \exp(j\Theta_n)^\circ \overline{Y_n}] \end{bmatrix}$$

where $G_n$ is a vector composed of the complex gains of each of the complex weights of the vector of complex weights at the time n, $\Theta_n$ is the vector composed of the complex delays of each of the complex weights of the vector of complex weights of the time n and the operator "∘" is defined as performing the multiplication of two vectors, component by component, the resultant being a vector.

4. The method as claimed in claim 1, comprising determining a constant R corresponding to the modulus of the envelope of the frequency-modulated radio signal emitted, the implementation of the iterative adaptation algorithm consisting in determining $G_n$, $\Theta_n$ able to minimize over time the cost function characterized by the following instantaneous gradient:

$$\nabla J_{CMA} = 2(|z_n|^2 - R^2) \begin{bmatrix} 2\text{Re}[z_n \exp(j\Theta_n)^\circ \overline{Y_n}] \\ -2\text{Im}[z_n G_n{}^\circ \exp(j\Theta_n)^\circ \overline{Y_n}] \end{bmatrix}$$

where $G_n$ is a vector composed of the complex gains of each of the complex weights of the vector of complex weights at the time n, $\Theta_n$ is the vector composed of the complex delays of each of the complex weights of the vector of complex weights of the time n and the operator "∘" is defined as performing the multiplication of two vectors, component by component, the resultant being a vector.

5. The method as claimed in claim 4, wherein the respective variations in $G_n$ and $\Theta_n$ over time are computed by means of the following formulae:

$$G_{n+1} = G_n - \mu_g(|z_n|^2 - R^2)\text{Re}[z_n \exp(j\Theta_n)^\circ \overline{Y_n}]$$

$$\Theta_{n+1} = \Theta_n + \mu_\theta(|z_n|^2 - R^2)\text{Im}[z_n G_n{}^\circ \exp(j\Theta_n)^\circ \overline{Y_n}]$$

where $G_n$ is a vector composed of the complex gains of each of the complex weights of the vector of complex weights at the time n, and where $\Theta_n$ is the vector composed of the complex delays of each of the complex weights of the vector of complex weights at the time n, and where $\mu_g$ and $\mu_\theta$ are the iterative steps chosen for the update of the gains and phases of each of the complex weights and where the operator "∘" is defined as performing the multiplication of two vectors, component by component, the resultant being a vector.

6. A radio receiver comprising a microcontroller configured to implement the method as claimed in claim 1.

7. A motor vehicle comprising a radio receiver as claimed in claim 6.

* * * * *